United States Patent
Lubitz et al.

(10) Patent No.: US 6,998,762 B2
(45) Date of Patent: Feb. 14, 2006

(54) PIEZOACTUATOR AND A METHOD FOR PRODUCING A PIEZOACTUATOR

(75) Inventors: Karl Lubitz, Ottobrunn (DE); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 3 days.

(21) Appl. No.: 10/362,936

(22) PCT Filed: Jul. 6, 2001

(86) PCT No.: PCT/DE01/02520

§ 371 (c)(1),
(2), (4) Date: May 12, 2004

(87) PCT Pub. No.: WO02/19441

PCT Pub. Date: Mar. 7, 2002

(65) Prior Publication Data

US 2004/0183401 A1 Sep. 23, 2004

(30) Foreign Application Priority Data

Aug. 31, 2000 (DE) ................................ 100 42 941

(51) Int. Cl.
*H01L 41/053* (2006.01)
*H01L 41/083* (2006.01)

(52) U.S. Cl. ...................... 310/354; 310/328; 310/346; 310/355

(58) Field of Classification Search ................ 310/328, 310/311, 346, 348, 354, 355
See application file for complete search history.

(56) References Cited

U.S. PATENT DOCUMENTS

| 4,438,364 | A | | 3/1984 | Morison ..................... 310/328 |
| 6,311,950 | B1 | * | 11/2001 | Kappel et al. ......... 251/129.06 |
| 6,313,568 | B1 | * | 11/2001 | Sullivan et al. ............. 310/346 |
| 6,575,138 | B1 | * | 6/2003 | Welch et al. ................ 123/467 |
| 6,766,965 | B1 | * | 7/2004 | D'Arrigo ................. 239/102.2 |

FOREIGN PATENT DOCUMENTS

| DE | 34 12 014 | 10/1985 |
| DE | 29 22 504 | 6/1990 |
| DE | 42 28 974 | 3/1994 |
| DE | 195 38 791 | 4/1997 |
| DE | 196 26 671 | 10/1997 |
| DE | 197 02 066 | 10/1998 |
| DE | 198 14 697 | 10/1999 |
| DE | 198 50 610 | 5/2000 |
| DE | 198 56 186 | 6/2000 |
| DE | 199 28 182 | 7/2000 |
| DE | 199 12 964 | 9/2000 |
| EP | 0 094 635 | 11/1983 |

* cited by examiner

Primary Examiner—Thomas M. Dougherty
(74) Attorney, Agent, or Firm—Young & Thompson

(57) ABSTRACT

The invention relates to a piezoactuator (1) comprising a piezoelectric body (4) and elements for pre-tensioning the piezoelectric body, consisting of a first (2) and a second (3) connecting element for transferring forces to the piezoelectric body (4). The actuator is provided with an element (6) for transferring tensile/pressure forces between the connecting elements (2, 3), said element being at least partially located in a gap (5) in the form of a bore in the piezoelectric body (4). According to the invention, the piezoactuator (1) is set to a defined working curve using the pre-tensioning elements (2, 3, 6). The piezoelectric body (4) is preferably produced by the lamination of piezoelectric layers, into which a gap is drilled after lamination and the component is subsequently sintered.

12 Claims, 4 Drawing Sheets

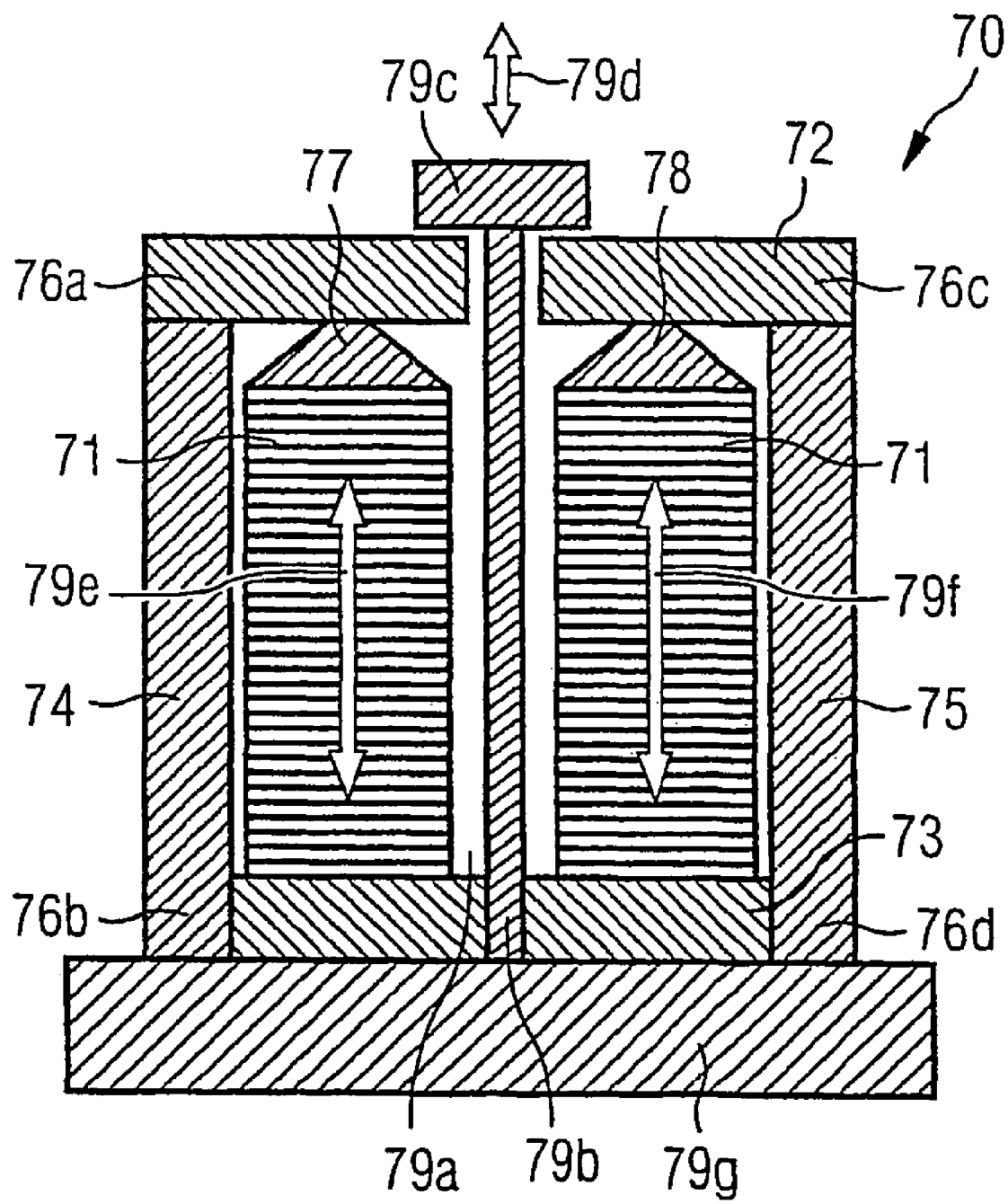

PIEZOACTUATOR AND A METHOD FOR PRODUCING A PIEZOACTUATOR

The invention relates to a piezoactuator with a piezoelectric body and elements for pre-tensioning the piezoelectric body, said elements consisting of a first and a second connecting element for transferring forces to the piezoelectric body, and an element for transferring tensile/pressure forces between the connecting elements, said element being disposed at least partially in a gap shaped in the form of a bore in the piezoelectric body. The invention relates furthermore to a method for producing a piezoactuator having a piezoelectric body with a gap shaped in the form of a bore.

A piezoactuator of this type and a production method of this type are disclosed in German Patent No. 198 14 697, which describes a piezoactuator comprising a piezoceramic body fashioned in the form of a cylinder, said piezoceramic body consisting of a piezoceramic multilayer which is helical in structure. This piezoceramic body has a central through bore serving to accommodate a mechanical clamping device, by means of which the piezoelectric body can be braced parallel to the cylinder axis between two terminal plates serving as connecting elements for transferring forces to the piezoelectric body. The respective terminal plates are connected with one another via a bar-shaped retaining element in which it is possible for a bore for conducting a cooling liquid to be provided.

In the method for producing a piezoactuator of this type, a hollow piezoceramic cylinder is initially furnished with cut surfaces running in the form of joined helices, into which cut surfaces electrode material is inserted in a subsequent process step. It is proposed as a variant of this production method that a cylinder be processed from electrode material, that helical cut surfaces be incorporated into this cylinder and that these cut surfaces then be filled with piezoceramic material.

The object of the invention is to create a piezoactuator with a low inherent spatial requirement, which piezoactuator will upon application of an electrical potential provide a precisely defined deflection of a drive unit.

This object is achieved by the piezoactuator according to claim 1. Further features, aspects, advantages and details of the invention will emerge from the dependent claims, the description and the drawings. Advantages, features and details of the invention which are described in relation to the piezoactuator will of course also apply to the method for producing a piezoactuator, and vice versa.

According to a first aspect of the invention, a piezoactuator of the type specified in the introduction is further developed in such a way that this piezoactuator is set to a defined working curve using the pre-tensioning elements.

It is in this way possible, given a piezoactuator of the same type of construction, to set this piezoactuator for different applications. Efficient piezoactuator modules can be created with integrated pre-tensioning and low installation space requirements. The design of the piezoactuator according to the invention makes it possible, depending on the particular design, to implement, for example, a displacement reversal, a defined setting of a working curve as a function of temperature, a defined setting of the absolute length of the module as a function of temperature (or temperature compensation), a force-displacement transformation and such like. Non-exclusive examples of these will be explained in greater detail in the further course of the description.

In a development of the invention, the piezoactuator has a mounting pad section which is rigidly connected with the piezoelectric body. In this way, a piezoactuator with a servo drive which moves relative to the mounting pad section will be created.

The piezoelectric body is advantageously designed as a monolithic piezoceramic multilayer actuator. In this way, a piezoactuator is created which can be economically produced. Piezoceramic multilayer actuators generally consist of a large number of alternately arranged ceramic layers and metal internal electrodes.

Preferably at least one connecting element for transferring forces to the piezoelectric body is designed as a clamping plate. This enables a good transfer of forces between the connecting element and the piezoelectric body. At high clamping forces an adequately rigid connection of the element for transferring tensile/pressure forces with the clamping plates can advantageously, but not exclusively, be achieved via a welded connection. Simultaneously and/or alternatively, the clamping plates can be designed appropriately both in terms of material and in terms of plate strength.

In a development of the invention, the element for transferring forces between the connecting elements is designed in the form of a solid profile. In this way, large forces can be transferred, adjustment of the rigidity of the element for transferring forces enabling precise determination of the working point of the piezoactuator in the force-displacement diagram.

The element for transferring forces between the connecting elements is advantageously designed in the form of a hollow profile.

In a further embodiment, a medium for cooling and/or thermostatic regulating can be provided or carried in the hollow profile. In this way it is possible to cool or to thermostatically regulate the piezoactuator using a coolant conducted through the hollow profile. Cooling of the piezoactuator is particularly suitable for highly dynamic control in the large-signal range. Thermostatic regulation is advantageous, for example, when a precisely settable and reproducible deflection is required.

A drive element of the piezoactuator is preferably accommodated in the hollow profile of the element for transferring forces between the connecting elements. In this way, reversal of the displacement of the drive unit of the piezoactuator can be achieved relative to the expansion of the piezoelectric body in the piezoactuator.

A thermal coupling medium can advantageously be provided at least in areas between the pre-tensioning elements and the piezoelectric body. Through thermal coupling, at least in areas, via the coupling medium, heat generation, heat injection, heat dissipation and the like can be controlled in a targeted directed and defined manner. The thermal coupling medium can, for example, be a plastic, a fluid or the like. The effectiveness of the cooling and/or thermostatic regulating, as described further above, can be increased further, for example, by introducing a thermal coupling medium between the hollow profile and the surface of the actuator.

In a further embodiment, the thermal expansion of the elements for pre-tensioning the piezoelectric body matches the thermal expansion of the piezoelectric body. In this way, by purposefully matching the thermal expansion coefficients of the piezoelectric body and of the pre-tensioning elements, a defined change in the displacement of the piezoactuator as a function of temperature is adjustably maintained.

The ceramics used for piezoactuators generally exhibit thermal expansion coefficients which deviate greatly from commonly used metals. The thermal expansion coefficients of the elements for pre-tensioning the piezoelectric body can, for example, through the appropriate selection of material, adaptation of the design (such as the strength, the laminate structure and the like) and the like be set so that the thermal expansion of the piezoactuator as a whole can be tailored precisely for the application concerned.

In a further embodiment, the rigidity of the elements for pre-tensioning the piezoelectric body can be matched to a required working point of the piezoactuator in the working curve. This can be achieved, for example, though not exclusively, through appropriate selection of the material, selection of the cross-section, configuration or construction of the pre-tensioning elements or parts thereof, in particular of the element for transferring tensile/pressure forces, as a laminate body and the like.

If, for example, a defined working curve is required in the force/displacement diagram as a function of temperature (that is, a targeted displacement change as a function of temperature), then this can be achieved by selectively combining the thermal expansion coefficients and the rigidity of the pre-tensioning elements.

The elements for pre-tensioning the piezoelectric body preferably comprise a cup spring. In a further embodiment, the elements for pre-tensioning the piezoelectric body can comprise a helical spring. In this way, through targeted selection of the temper of the spring, a defined working displacement and working point of the piezoactuator can be adjustably maintained.

It is advantageous to provide at least one further element for frictionally connecting the first and second connecting element for transferring forces to the piezoelectric body. In this way, solid state joints are created on the connecting elements, which solid state joints enable a curved working traverse of a drive unit of the piezoactuator, wherein a lever action can be utilized for the working displacement.

According to a second aspect of the invention, a method for producing a piezoactuator, in particular a piezoactuator as described hereinabove according to the invention, is provided, in which method a piezoelectric body is produced by laminating piezoceramic layers. A gap shaped in the form of a bore is drilled in this piezoelectric body after lamination. After the drilling process, the piezoelectric body is then sintered. After completion of the piezoelectric body, the piezoactuator is then pre-tensioned using elements for pre-tensioning the piezoelectric body, said elements having a first and a second connecting element for transferring forces to the piezoelectric body and an element for transferring tensile/pressure forces between the connecting elements, said element being at least partially located in a gap shaped in the form of a bore in the piezoelectric body, the piezoactuator being set to a defined working curve using the pre-tensioning elements.

In this way, a piezoactuator is created, the piezoelectric body of which has a high electric flashover resistance and short-circuit strength. At the same time, the gap in the piezoelectric body of the piezoactuator can be produced to extremely precise dimensions. This production method also makes it possible for piezoactuators to be produced economically in large unit numbers.

Further features and advantages of the invention are shown in the drawings and are described hereinbelow.

FIGS. 5, 6 and 7 are each sectional views of piezoactuators with solid state joints.

Figure 1:
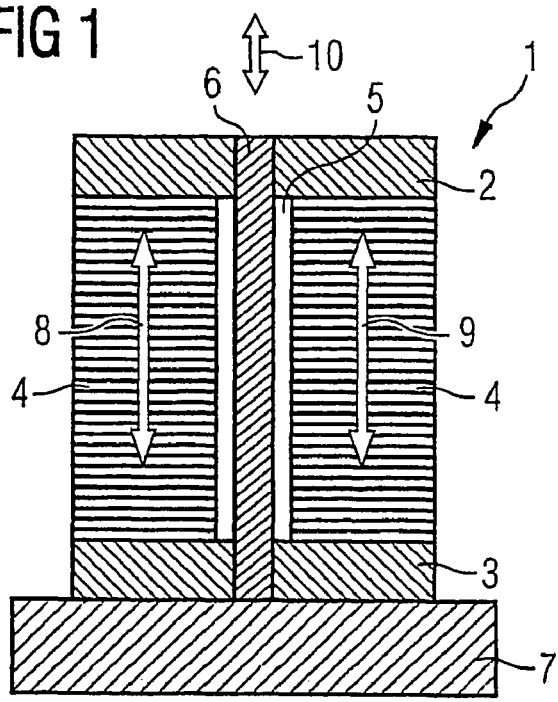
FIG. 1 is a sectional view of an embodiment of a piezoactuator with a first and a second clamping plate.

The piezoactuator 1 shown in FIG. 1 has a first and a second clamping plate 2 and 3 which serve respectively as a first and second connecting element for transferring forces to a piezoelectric body 4. The piezoelectric body 4 is constructed as a monolithic piezoceramic multilayer actuator and has centrally a through-hole, circular in cross-section, held as a gap shaped in the form of a bore 5. In this gap 5 runs a metal bar 6 serving as an element for transferring forces between the clamping plate 2 and the clamping plate 3 and holding the piezoelectric body 4. The clamping plates 2 and 3 and the metal bar 6 are designed for transferring high clamping forces to the piezoelectric body, for example, for clamping forces in the region of 850 N.

The clamping plate 3 is fixed on a mounting pad section 7, by means of which the piezoactuator 1 is fastened in an intended operating location. The piezoactuator 1 can receive an electrical signal via terminals for supplying an electrical potential, which terminals are not described further. This electrical signal results in an expansion or contraction of the piezoelectric body 4 corresponding to a movement indicated by the bidirectional arrows 8 and 9. Such a movement of the piezoelectric body 4 is transferred to the clamping plate 2 which represents a drive unit for a drive movement indicated by the bidirectional arrow 10.

The thermal expansion of the metal bar 6 is adapted here to the thermal expansion of the piezoelectric body 4. This action can firstly achieve a temperature-independent working curve of the piezoactuator 1, wherein the thermal expansion of the piezoelectric body 4 compensates for the thermal expansion of the metal bar 6 and of the clamping plates 2 and 3. However, it is also possible as an alternative to this action to select a defined ratio of the thermal expansion of the metal bar 6 and the piezoelectric body 4 such that a defined change can be achieved in the working curve of the piezoactuator 1 as a function of temperature.

As well as through selection of the thermal expansion of the metal bar 6 and of the piezoelectric body 4, the working curve of the piezoactuator 1 can also be fixed by adjusting the mechanical tension loading between the clamping plates.

This can be achieved, for example, by appropriate selection of the geometric dimensions of the metal bar 6, the clamping plate 2, 3 and the piezoelectric body before final assembly of the piezoactuator 1. In order to brace the clamping plates 2, 3 via the metal bar 6, suitable threaded clamping units or equivalent means can, however, also be provided in the components concerned.

In order to enable a force to be introduced evenly across the entire face of the piezoelectric body 4, the clamping plates 2 and 3 are advantageously kept curved. Particularly large forces can be transferred between the metal bar 6 and the clamping plates 2 and 3 if the metal bar 6 and the clamping plates 2 and 3 are connected by means of welded joints.

Figure 2:
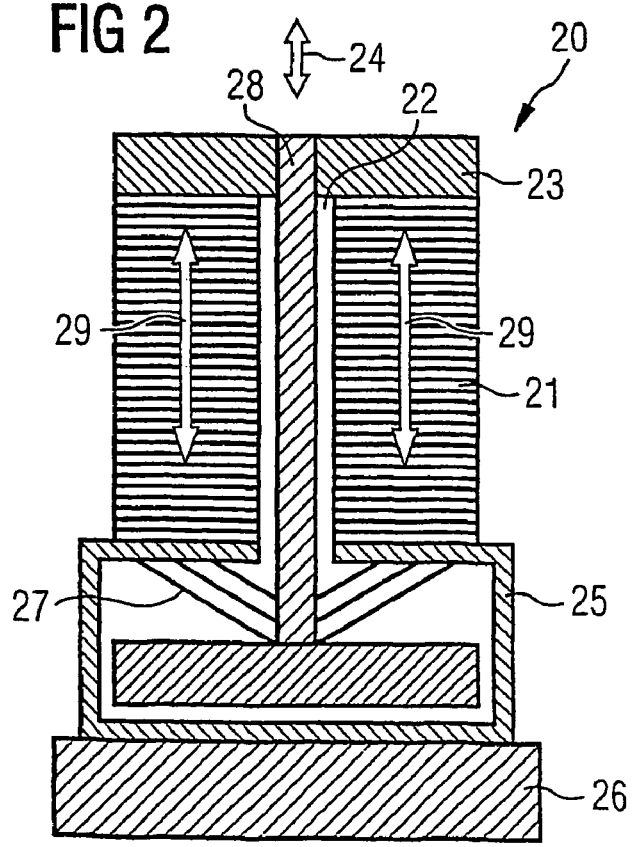
FIGS. 2 and 3 are each sectional views of piezoactuators pre-tensioned by means of a cup spring.

In the piezoactuator 20 shown in FIG. 2, a piezoelectric body 21 which is provided with a through-hole implemented as a gap in the form of a bore 22 is held on one side by a clamping plate 23 serving as a drive unit. On the other side, the piezoelectric body 21 is connected with a base element 25 shaped in the form of a hollow profile, which base element is fixed on a mounting pad section 26.

The piezoelectric body 21 is braced between the clamping plate 23 and the base element 25 in the form of a hollow profile by the force of a cup spring 27, the spring tension of which is transferred through a metal bar 28. By selecting the tensional force of the cup spring 27 appropriately, it is possible to set any required working curve of the piezoactuator 20 based on suitable pre-tensioning of the piezoelectric body 21.

Applying a voltage to the piezoelectric body 21 via electrical terminals not described further causes an expansion or contraction movement of the piezoelectric body corresponding to the movement indicated by the bidirectional arrows 29. This expansion or contraction of the piezoelectric body 21 is transferred to the clamping plate 23 serving as a drive unit, which clamping plate then moves in accordance with the bidirectional arrow 24.

The thermal expansion of the metal bar 28, of the cup spring 27 and of the piezoelectric body 21 are in turn advantageously matched to one another.

Through appropriate selection of the spring temper of the cup spring 27 and the specification of an appropriate pre-tensioning force for the piezoelectric body 21 it is possible, as in the piezoactuator 1 described by FIG. 1, to set a defined working curve.

In place of the cup spring 27, a helical spring or another suitable spring element can also be used.

Figure 3:
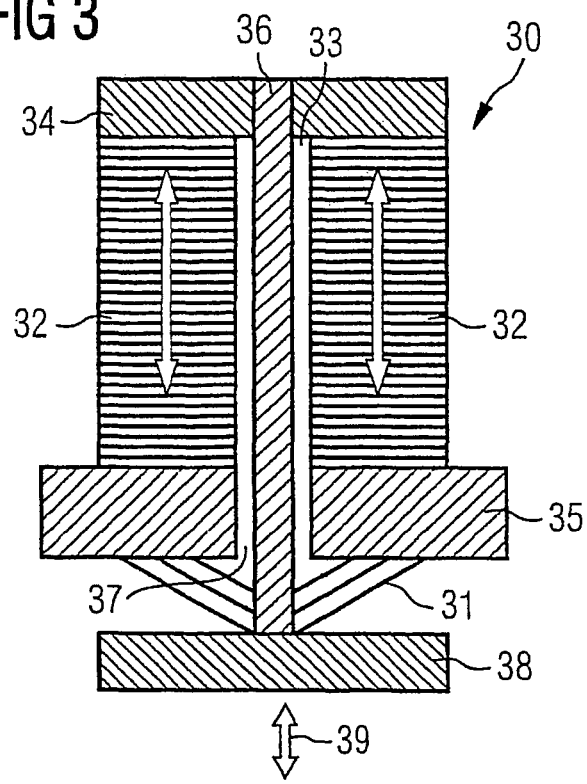

The functional principle of the piezoactuator 30 shown in FIG. 3 corresponds in principle to that of piezoactuator 20 from FIG. 2. However, the piezoactuator 30 has a cup spring 31 in order to brace a piezoelectric body 32 having a through-hole shaped as a gap in the form of a bore 33 between a clamping plate 34 and a mounting pad section 35 via a metal bar 36. A working opening 37 is provided in the mounting pad section 35, through which opening the metal bar 36 juts so as to initiate in a drive unit 38 a drive movement running in accordance with the bidirectional arrow 39. The direction of this drive movement is the reversal of the displacement relative to the piezoactuator shown in FIG. 2, that is, when the piezoelectric body 32 expands, the drive area moves toward the mounting pad section 35, and when the piezoelectric body contracts, the drive area moves by contrast away from this mounting pad section.

In contrast with this, an expansion of the piezoelectric body 21 in piezoactuator 21 from FIG. 2 produces a displacement movement which guides the clamping plate 23 serving as a drive mechanism away from the mounting pad section, and produces conversely, when the piezoelectric body 21 contracts, a movement in the direction of the mounting pad section 26.

It should be noted that, like the piezoactuator 20 from FIG. 2, the piezoactuator 30 shown in FIG. 3 can also be constructed with helical springs or another suitable spring element in place of a cup spring. As in the case of the piezoactuators shown in FIG. 1 and FIG. 2, the thermal expansion of the components of the piezoactuator 30 are in turn advantageously matched to one another in order either to enable a temperature-independent working curve of the piezoactuator or to create a piezoactuator the working curve of which changes in a defined way as a function of temperature. Furthermore, in conformity with the remarks in relation to FIGS. 1 and 2, the working curve of the piezoactuator can be set in a defined way through appropriate pre-tensioning of the piezoelectric body 32 using the clamping plate 34, the mounting pad section 35, the cup spring 31 and the metal bar 36.

Figure 4:
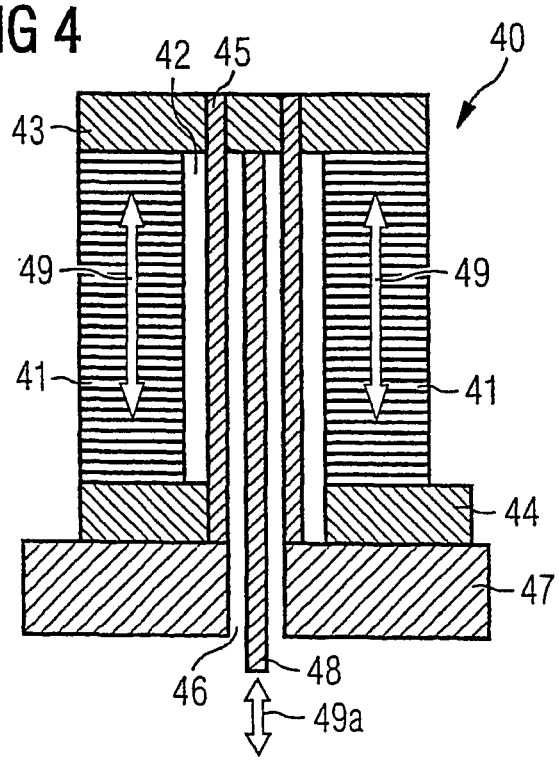
FIG. 4 is a sectional view of a piezoactuator with a joining element shaped in the form of a hollow profile between connecting elements for transferring forces to a piezoelectric body.

FIG. 4 shows a piezoactuator 40 with a piezoelectric body 41 which, in turn, has a through-hole implemented as a gap shaped in the form of a bore 42 and is braced between a first clamping plate 43 and a second clamping plate 44 with a bar implemented in the form of a hollow profile. The piezoelectric body 41 is fixed with the second clamping plate 44 on a mounting pad section 47 furnished with a through opening 46. A drive rod 48 is provided in the piezoactuator 40 as a drive unit, which drive rod runs in the bar held in the form of a hollow profile 45, juts through the through opening 46 in the mounting pad section 47 and is fixed in the area of the first clamping plate 43. When there is a defined expansion or contraction of the piezoelectric body 41 corresponding to a movement indicated by means of the bidirectional arrows 49, a drive movement of the drive rod 48 is generated toward the mounting pad section 47 or away from the mounting pad section in accordance with the bidirectional arrow 49a.

In order to counteract any rise in temperature of the piezoactuator 40 during operation, there can be provision for introducing a cooling fluid in the hollow-profile form of the bar 45. The temperature of the piezoactuator is then preferably regulated so as to enable precisely definable and reproducible deflections even for highly dynamic control in the large-signal range.

As in the case of the piezoactuator shown in FIG. 3, however, a reversal of the displacement of the drive unit of piezoactuator 40 by comparison with the drive units of the piezoactuators from FIGS. 1 and 2 is achieved.

As far as the selection of the thermal expansion of the components used and the mechanical pre-tensioning of the piezoelectric body 41 are concerned, the explanations relating to FIGS. 1 to 3 should be referred to.

Figure 5:
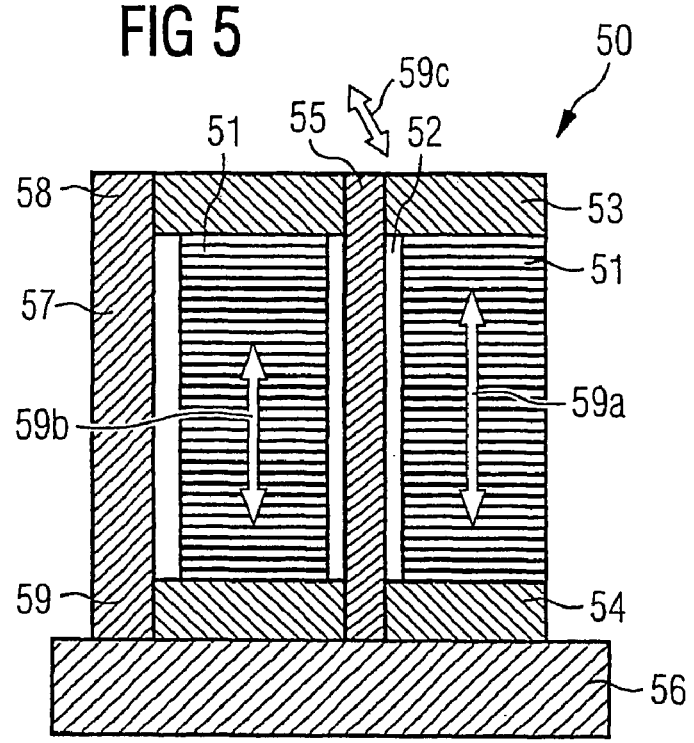

FIG. 5 shows a piezoactuator 50 which, like the piezoactuator described previously, has a piezoelectric body 51 with a through-hole which is held as a gap shaped in the form of a bore 52. The piezoelectric body 51 is braced between a first clamping plate 53 and a second clamping plate 54 via a bar 55 and is fixed on a mounting pad section 56. In addition, the first clamping plate 53 and the second clamping plate 54 are connected via a connecting arm 57 which acts as a solid state joint in areas 58 and 59. When an electrical voltage is applied to the piezoactuator 50 via electrical terminals which are not described further, a contraction or expansion of the piezoelectric body 51 is generated, which contraction or expansion proceeds asymmetrically, however, because of the solid state joints in areas 58 and 59 so that in the first clamping plate 53 serving as a drive unit a drive movement describing the form of an arc is produced, as indicated by means of the bidirectional arrow 59c.

As far as the selection of the thermal expansion of the components used and the mechanical pre-tensioning of the piezoelectric body 41 are concerned, the explanations relating to FIGS. 1 to 3 should be referred to.

Figure 6:
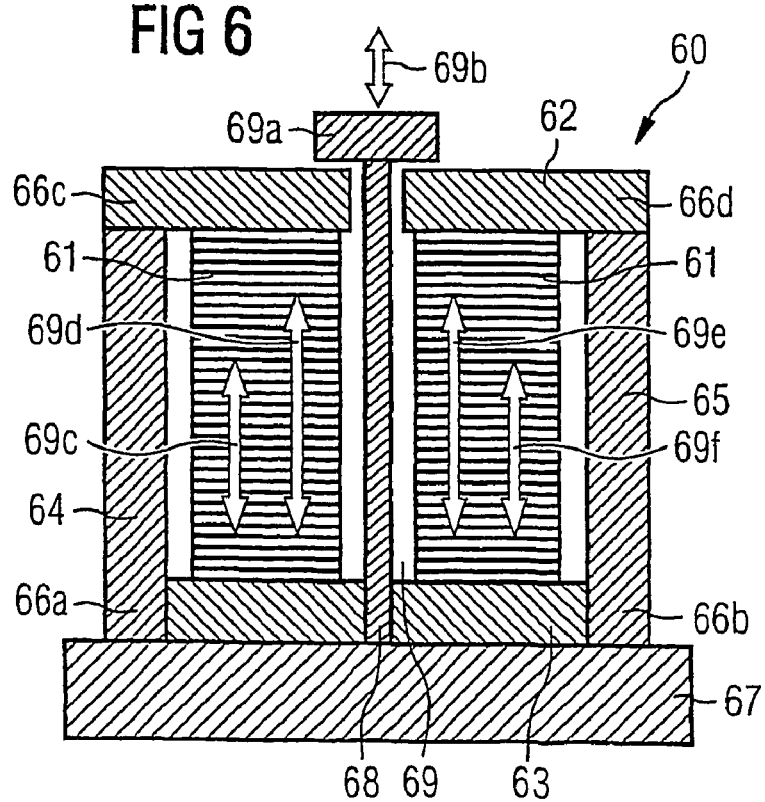

The piezoactuator 60 in FIG. 6 contains a piezoelectric body 61 which is mechanically braced by means of a first clamping plate 62, a second clamping plate 63 and by means of connecting arms 64 and 65 running outside the piezoelectric body 61 and forming solid state joints 66a, 66b, 66c and 66d.

The piezoelectric body 61 is fixed on a mounting pad section 67 via the second clamping plate 63. In piezoactuator 60 there is provided a bar 68 which runs in a gap in the form of a bore fashioned as a through-hole 69 in the piezoelectric body 61 and provides a drive movement in an area 69a serving as a drive unit. When an electrical potential is applied to the piezoactuator 60, an uneven expansion corresponding to arrows 69c, 69d, 69e and 69f is generated on account of the clamping of the piezoelectric body 61 between the first clamping plate 62 and the second clamping plate 63, which uneven expansion produces an arching of the first clamping plate 62. This results in a movement of the bar 68 in the area 69a in a manner as indicated by the bidirectional arrow 69b.

A lever action of the selected first clamping plate 62 on the area 69a is thus exploited for the movement of the area 69a serving as a drive unit. This lever action enables a transformation of the expansion or contraction movement of the piezoelectric body 61, i.e. the displacement of the area 69a serving as a drive unit is increased relative to the displacement of the expansion or contraction movement of the piezoelectric body 61.

As far as the selection of the thermal expansion of the components used and the mechanical pre-tensioning of the piezoelectric body are concerned, the explanations relating to FIGS. 1 to 3 should be referred to.

FIG. 7 shows a piezoactuator 70, the method of operation of which matches that of piezoactuator 60 from FIG. 6. The piezoactuator 70 contains a piezoelectric body 71 which is enclosed and braced between a first clamping plate 72 and a second clamping plate 73 via lateral clamping arms 74 and 75, forming solid state joints 76a, 76b, 76c and 76d. In areas 77 and 78, the piezoelectric body 71 is held by a connecting cover shaped in the form of a ring, the connecting cover being trapezoidal in cross-section, so as to ensure that, when the surface of the connecting cover in contact with the first clamping plate 72 is only limited, the clamping force passes symmetrically to the piezoelectric body 71. In the piezoelectric body 71 there is provided a gap 79a held as a through-hole shaped in the form of a bore, which gap accommodates a bar 79b serving as a drive unit. If an electrical voltage signal is applied to the piezoactuator 70 via electrical terminals not shown further causing an expansion or contraction of the piezoelectric body 71, as indicated by the bidirectional arrows 79e and 79f, relative to the mounting pad section 79g, then the bar 79b executes a drive movement, indicated by the bidirectional arrow 79d, in an area 79c.

As far as the selection of the thermal expansion of the components used and the mechanical pre-tensioning of the piezoelectric body are concerned, the explanations relating to FIGS. 1 to 3 should be referred to.

It is of course possible to modify the drive concept of the piezoactuators from FIGS. 6 and 7 to the effect that a drive occurs with a reversal of displacement relative to the expansion and contraction of the piezoelectric body, as has been explained for piezoactuators 30 and 40 using FIGS. 3 and 4.

The piezoelectric body of the piezoactuators shown in FIGS. 1 to 7 can be implemented in cylindrical form but can also be fashioned in trapezoid form, cuboid form or with an ellipsoidal cross-section. Instead of keeping the through-hole passing through the piezoelectric body circular, it is also possible to provide a cross-section in the form of a rectangle, for example a square cross-section. In general, the tensioning of the piezoelectric body is selected such that the piezoactuator has a working curve which is favorable for its use. The elastic and thermoelastic properties of the material used, in particular of the piezoelectric bodies and the clamping devices are matched to one another for this purpose.

By providing cooling means for a piezoactuator, it is possible virtually to exclude temperature effects on any drive movement provided. Particularly precise drive movements can be achieved with a piezoactuator which is operated at a regulated temperature.

The piezoelectric body in the piezoactuators shown in FIGS. 1 to 7 can be implemented as a sintered ceramic, the gap in it in the form of a bore being created by means of drilling. There is always the risk here that insulating layers located on the piezoelectric body will be damaged in the area of the clamping plates, which damage can not least result also in an inhomogeneous distribution of the clamping forces. It must also be expected that in the drilling process in the area of the gap shaped in the form of a bore material from internal electrodes located there will be smeared solidly over the interior surface of the bore. This can lead in subsequent electrical operation of the piezoelectric body to the occurrence of flashovers and short circuits.

If, by contrast, multilayer components are used as piezoelectric bodies, then because of their low resistance to delamination cracks, low feedrates must be operated at when they are being processed, and there is the risk that if rinsing water and boring dust is inadequately removed, excess mechanical tensions will occur leading to destruction of the component through cracking.

It is, however, advantageous to produce the piezoelectric body in the piezoactuator shown in FIGS. 1 to 7 from a piezostack which is still in a green state, i.e. is mechanically processed immediately after lamination of the stack. The through boring in the respective piezoelectric bodies can be carried out using normal twist drills, with cooling and lubrication of the drill being unnecessary because the material is still soft. Because of the softness of the material the pressure on the drill required to achieve an adequate feedrate can also be kept low. If, in addition, drilling base plates are used in the drilling process, no chipping will occur. While the drilling process also produces in these piezoelectric bodies smearing of metal internal electrodes which can be implemented, for example, as internal Ag/Pd electrodes, in subsequent sintering of the component these smears, particularly the silver constituent, diffuse into the component and are eliminated with the formation of an as-fired sintered surface. The sintered component can then be processed further without any requirement for post-processing in the area of the through-hole. This then provides adequate flashover resistance and short-circuit strength in this area directly. Instead of producing the through-hole using a drill, there is in principle also the possibility of processing the raw piezoelectric body using turning, milling and similar methods. This green processing method enables in particular, the efficient production of very large unit numbers of blanks of a piezoelectric body which is outstandingly suitable for use in a piezoactuator as shown in FIGS. 1 to 7.

What is claimed is:

1. A piezoactuator comprising a piezoelectric body in the form of a monolithic piezoceramic multilayer actuator; and
    elements for pre-tensioning the piezoelectric body, comprising a first and a second connecting element for transferring forces to the piezoelectric body; and
    an element for transferring tensile/pressure forces between the connecting elements, said element being at least partially disposed in a gap shaped in the form of a bore in the piezoelectric body, wherein
    the piezoactuator is set to a defined working curve using the pre-tensioning elements, characterized in that to set the defined working curve, thermal expansion of the piezoelectric body and thermal expansion of the pre-tensioning elements are matched to one another; and
    wherein the member for transferring forces between the connecting elements is constructed in the form of a hollow profile.

2. A piezoactuator according to claim 1, wherein the piezoactuator has a mounting pad section with which the piezoelectric body is rigidly connected.

3. A piezoactuator according to claim 1, wherein at least one connecting element for transferring forces to the piezoelectric body is constructed as a clamping plate.

4. A piezoactuator according to claim 1, wherein the member for transferring forces between the connecting elements is constructed in the form of a solid profile.

5. A piezoactuator according to claim 1, wherein a medium for cooling and/or thermostatic regulating is provided or is carried in the hollow-profile form.

6. A piezoactuator according to claim 1, wherein a drive element of the piezoactuator is accommodated in the hollow-profile form of the element for transferring forces between the connecting elements.

7. A piezoactuator according to claim 1, wherein the thermal expansion of the elements for pre-tensioning the piezoelectric body corresponds to the thermal expansion of the piezoelectric body.

8. A piezoactuator according to claim 1, wherein the rigidity of the elements for pre-tensioning the piezoelectric body is matched to a required working point of the piezoactuator in the working curve.

9. A piezoactuator according to claim 1, wherein the elements for pre-tensioning the piezoelectric body comprise a cup spring.

10. A piezoactuator according to claim 1, wherein the elements for pre-tensioning the piezoelectric body comprise a helical spring.

11. A piezoactuator according to claim 1, further comprising at least one further element for frictionally connecting in the first and second connecting element for transferring forces to the piezoelectric body.

12. A piezoactuator comprising a piezoelectric body in the form of a monolithic piezoceramic multilayer actuator; and elements for pre-tensioning the piezoelectric body, comprising a first and a second connecting element for transferring forces to the piezoelectric body; and an element for transferring tensile/pressure forces between the connecting elements, said element being at least partially disposed in a gap shaped in the form of a bore in the piezoelectric body, wherein the piezoactuator is set to a defined working curve using the pre-tensioning elements, characterized in that to set the defined working curve, thermal expansion of the piezoelectric body and thermal expansion of the pre-tensioning elements are matched to one another; and wherein a thermal coupling medium is provided at least in areas between the pre-tensioning elements.

* * * * *